(12) United States Patent
Oderkerk et al.

(10) Patent No.: US 11,491,767 B2
(45) Date of Patent: *Nov. 8, 2022

(54) MULTILAYER ELEMENT (71) Applicant: BOREALIS AG, Vienna (AT)

(72) Inventors: Jeroen Oderkerk, Stenungsund (SE); Denis Yalalov, Stenungsund (SE); Qizheng Dou, Linz (AT); Francis Costa, Linz (AT)

(73) Assignee: BOREALIS AG, Vienna (AT)

( * ) Notice: Subject to any disclaimer, the term of this patent is extended or adjusted under 35 U.S.C. 154(b) by 0 days.

This patent is subject to a terminal disclaimer.

(21) Appl. No.: 17/042,975

(22) PCT Filed: Apr. 16, 2019

(86) PCT No.: PCT/EP2019/059824
§ 371 (c)(1),
(2) Date: Sep. 29, 2020

(87) PCT Pub. No.: WO2019/201936
PCT Pub. Date: Oct. 24, 2019

(65) Prior Publication Data
US 2021/0023822 A1 Jan. 28, 2021

(30) Foreign Application Priority Data
Apr. 16, 2018 (EP) .................................. 18167412

(51) Int. Cl.
*B32B 17/10* (2006.01)
*H02S 20/26* (2014.01)
(Continued)

(52) U.S. Cl.
CPC .. *B32B 17/10697* (2013.01); *B32B 17/10036* (2013.01); *B32B 2457/12* (2013.01); *H02S 20/26* (2014.12)

(58) Field of Classification Search
None
See application file for complete search history.

(56) References Cited

U.S. PATENT DOCUMENTS

| 6,159,608 A | 12/2000 | Friedman et al. |
| 8,772,625 B2 | 7/2014 | Ikenaga et al. |

(Continued)

FOREIGN PATENT DOCUMENTS

| CN | 1197464 A | 10/1998 |
| CN | 105122464 A | 12/2015 |

(Continued)

OTHER PUBLICATIONS

Dow Engage(R) 8150 Polyolefin Elastomer data sheet from Matweb (Year: 2022).*

(Continued)

*Primary Examiner* — Ramsey Zacharia
(74) *Attorney, Agent, or Firm* — Tarolli, Sundheim, Covell & Tummino LLP (57) ABSTRACT

The present invention relates to a multilayer element (LE), the use of the multilayer element (LE) for producing an article, an article comprising multilayer element (LE), a layer element of at least two layers, the use of the polymer composition of the invention to produce a multilayer element, as well as to a process for producing the multilayer element (LE) and an article thereof.

8 Claims, 2 Drawing Sheets

(51) Int. Cl.
*B32B 27/32* (2006.01)
*H01L 31/048* (2014.01)
*C08F 210/16* (2006.01)
*C08F 255/02* (2006.01)
*C08K 5/00* (2006.01)
*C08K 5/14* (2006.01)
*C08L 23/08* (2006.01)

(56) References Cited

U.S. PATENT DOCUMENTS

| | | | |
|---|---|---|---|
| 9,147,784 | B2 | 9/2015 | Shirahige et al. |
| 9,193,854 | B2 | 11/2015 | Ikenaga et al. |
| 2008/0115825 | A1 | 5/2008 | Patel et al. |
| 2010/0143676 | A1 | 6/2010 | Hahn et al. |
| 2013/0167911 | A1 | 7/2013 | Ikenaga et al. |
| 2015/0000739 | A1 | 1/2015 | Ikenaga et al. |
| 2015/0083207 | A1 | 3/2015 | Shirahige et al. |

FOREIGN PATENT DOCUMENTS

| | | |
|---|---|---|
| EP | 2587551 A1 | 5/2013 |
| EP | 2958151 A1 | 12/2015 |
| JP | 0912344 A | 1/1997 |
| JP | 11508842 A | 8/1999 |
| JP | 2010504646 A | 2/2010 |
| JP | 2010504647 A | 2/2010 |
| JP | 2013528951 A | 7/2013 |
| JP | 2014506938 A | 3/2014 |
| JP | 20144099629 A | 5/2014 |
| JP | 2014175544 A | 9/2014 |
| KR | 20010072395 A | 7/2001 |
| KR | 20100068297 A | 6/2010 |
| WO | 97/11986 A1 | 4/1997 |
| WO | 2008/036708 A2 | 3/2008 |
| WO | 2008036708 A2 | 3/2008 |
| WO | 2011/150193 A1 | 12/2011 |
| WO | 2011150193 A1 | 12/2011 |
| WO | 2014126121 A1 | 8/2014 |
| WO | 2014/176088 A1 | 10/2014 |
| WO | 2017076628 A1 | 5/2017 |

OTHER PUBLICATIONS

Japanese Patent Application No. 2020-552710; Japanese Notice of Reasons for Rejection dated Nov. 24, 2021; 6 Pgs.

Brandolini, A.J., et al., "NMR Spectra of Polymers and Polymer Additives", Marcel Deker, Inc. 2000.

Klimke, K., et al., Optimisation and Application of Polyolefin Branch Quantification by Melt-State 13C NMR Spectroscopy, Marcomol. Chem. Phys. 2006;2017:382.

Parkinson, M., et al., "Effect of Branch Length on 13C NMR Relaxation Properties in Molten Poly[ethylene-co-(a-olefin)] Model Systems", MNacromol. Chem Phys. 2007;208;2128.

Castignolles, P., et al., "Detection and quantification of branching in polyacrylates by size-exclusion chromatography (SEC) and melt-state 13C NMR spectroscopy", Polymer 50 (2009) 2373.

Applicant: Borealis AG; A Multilayer Element; Korean Application No. 10-2020-70252318; Notice of Reason for Rejection dated Apr. 29, 2022; 59 pgs.

Engage (TM) 8150 Polyolefin Elastomer—Technical Information—Dow; Form No. 400-00030951en; May 17, 2011; 3 pgs.

Applicant: Borealis AG; "A Multilayer Layer Element"; Chinese Patent Application No. 201980021661.3; Chinese Office Action dated Jul. 5, 2022; 18 pgs.

\* cited by examiner

MULTILAYER ELEMENT

The present invention relates to a multilayer element (LE) being suitable i.a. for use in construction applications, vehicles etc., like a safety layer element, an insulation element or a thermal layer element, or in any combination thereof, an article comprising the multilayer element (LE), a layer element of at least two layers, the use of the polymer composition of the invention to produce the multilayer element (LE) and an article thereof, as well as to a process for producing the multilayer element (LE) and the article thereof.

BACKGROUND ART

For instance in construction applications, like building applications, different type of layer elements are used including façade, window, wall and door elements. These layer elements may be designed to have various features, like protective, i.e. safety, insulation and/or thermal feature, just as an example.

Accordingly, e.g. elements with safety functionality include so called "safety glass" elements of various types for use in various applications. "Safety glass" means herein a laminated glass layer element or a laminated polymeric layer element, typically a laminated glass layer element, with additional safety feature which makes it less likely to break, or if breaks, then typically holds together when shattered.

Laminated glass, such as safety glass, can be e.g. a layer element comprising typically a first rigid layer, at least an interlayer and a second layer, in that order. The first rigid layer and optionally (and conventionally) the second layer are typically layer(s) of a glass material or of a rigid polymeric material, like polycarbonate. The interlayer between said first and second rigid layer is often based on polyvinyl butyral (PVB) or ethylene-vinyl acetate (EVA).

When the first and/or second layer element (typically of glass material) break(s), then the interlayer element should hold/support/bond the first layer element and the second layer element together (bonded). I.e. the interlayer element has an adhering function, namely prevents the first and/or second layer element from breaking up into large sharp pieces.

Accordingly, safety glass is normally used when there is a possibility of human impact or where the glass could fail if shattered.

The use of PVB as interlayer material may have a drawback of being sensitive to moisture and usually requires a special controlled storage conditions (temperature and humidity). Moreover, due to moisture sensitivity the adhesion properties may be impaired.

In case of EVA as interlayer material, EVA must usually have high VA content to get feasible flowability/processability behavior. The conventional EVA with high VA content has then also very high $MFR_2$ (more than 15 g/10 min).

For instance, laminated glass layer element for applications for vehicle, building and construction, architectural glasses, interior/exterior design applications, (usually of glass or non-flexible polymeric material) is typically produced by laminating the layer elements together. For the production of architectural and automotive laminated safety glass with a polymer material interlayer, like PVB interlayer, direct pressing of the loosely placed sandwich glass/film/glass is not a suitable method to produce said laminated safety glass without air inclusions. For example, the lamination of safety glass with PVB as interlayer is mostly done in two production steps to eliminate any air inclusions in the final product. The first step, so-called pre-lamination, is processed prior to the actual heating-pressing step. The quality of this pre-lamination is of major importance for the quality of the final laminated glass. A distinction is made in pre-lamination between rolling press and the vacuum process. The latter is subdivided into the vacuum bag process and the vacuum-ring process. During the second step, these pre-laminated constructions are then heated under pressure in an autoclave or oven, to achieve the final bounded product.

Lamination process in case of PVB requires high temperature and long duration.

The properties of the chosen layer materials may also not be sufficient to meet overall property requirements needed for the above end applications.

Accordingly, there is a continuous need for solutions of layer elements suitable for use in demanding construction, vehicle etc. applications, like safety, insulation and/or thermal end applications, to meet the challenging requirements for industrially feasible solutions.

BRIEF DESCRIPTION OF THE DRAWINGS

FIG. 1 illustrates the most preferable embodiment of the layer element (LE) of the invention, wherein the surface of the interlayer layer element (i) facing the surface of the first layer element (1) are in direct contact with each other and preferably without any adhesive layer(s) in between; and, on the opposite side of the interlayer element (i), the surface of the interlayer layer element (i) facing the surface of the second layer element (2) are in direct contact with each other and preferably without any adhesive layer(s) in between.

THE DESCRIPTION OF THE INVENTION

Accordingly, the present invention is directed to a multilayer element (LE) comprising a first layer element, an interlayer element and a second layer element, in the given order, wherein the first layer element comprises a glass layer or a polymeric layer;

the interlayer element comprises a polymer composition comprising a) at least a crosslinked ethylene copolymer, whereby the ethylene copolymer before being crosslinked fulfills the characteristics (i) and (ii)

(i) being a copolymer of ethylene and a $C_4$ to $C_8$ alpha olefin comonomer and (ii) having a density (according to ISO 1183) in the range of 855 kg/m³ to below 880 kg/m³, and the second layer element comprises a glass layer or a polymeric layer;

and wherein the interlayer element is in adhering contact with said first and second layer element.

The multilayer element (LE) as defined above, below or in the claims can be used for any purposes needed e.g. in construction, building or vehicles, like as a safety layer element, an insulation layer element or a thermal layer element, or in any combination thereof.

Consequently, the multilayer element (LE) of the invention preferably has at least one of safety, insulation or thermal feature in that the multilayer element (LE) meets demanding requirements for use as part or as such in a safety, insulation and/or thermal layer element applications.

The multilayer element (LE), as defined above, below or in claims, is referred herein also shortly as "layer element (LE)".

The first layer element and, respectively, the second layer element of the multilayer element (LE) as defined above, below or in claims are preferably rigid layer elements.

"Rigid" means herein that the element is stiff and cannot be bended in a manner as flexible elements, and if bended, then typically the integrity of the element typically breaks easily causing permanent fractures, as is not the case with flexible element. A skilled person can easily differentiate a rigid and flexible layer element.

As defined above, below or in claims, these layer elements, preferably rigid layer elements, of the multilayer element (LE) as defined above, below or in claims can be independently a glass layer or a polymeric layer.

The expression "the interlayer element is in adhering contact with said first and second layer element" means herein in that the outmost surface of the interlayer element adhering to the outmost surface of the first layer element and, respectively, the outmost surface of the interlayer element adhering to the outmost surface of the second layer element can be in direct adhering contact or, alternatively, there can be an adhesive layer between the adhering surface of the interlayer element and one or both of the first layer element and the second layer element.

The expression "element" in said first layer element, in said second layer element and in said interlayer element refers in this application to different functionalities of these layer components, namely said first and second layer element have independently one or more functions related to the end use of the multilayer element, such as e.g. safety, insulation and/or thermal function, whereas the interlayer element has differing, i.e. adhering, function. All these functional layer elements together with interlayer element provide the resulting, e.g. safety, insulation and/or thermal, functionality to the final article.

Meaning of safety element is already given above under background art. The insulation element includes acoustic (sound) insulation element or thermal insulation element as known in the art. The insulation element can also have both acoustic and thermal functionalities. The thermal element can be provided e.g. with heating means, like electrical wires. The heating is then effected by conducting electric current to said wires. Example of a combination of safety and thermal element is e.g. front window (windscreen) in vehicles, like cars, which is provided with heating means and also functions as safety glass.

The ethylene copolymer (a), as defined above, below or in claims, is referred herein also shortly as "polymer (a)" or "copolymer (a)".

The claimed specific interlayer element comprising the copolymer (a) of the layer element (LE) of the invention has surprisingly low haze In addition the use of copolymer (a) for the specific interlayer has several advantages compared to EVA and/or PVB used according to the state of the art, since the copolymer (a) I.a. is easier to store than PVB, releases no acid at temperatures above 150° C. as EVA and has no strong smell like EVA or PVB Moreover, the polymer composition of interlayer element of the multilayer element (LE) is crosslinked. In crosslinking application, lower temperatures can be used during the production process, therefore any premature crosslinking of the polymer composition of the interlayer element can be reduced or avoided. The crosslinking of the interlayer element further improves the optical properties, such as haze, of the multilayer element (LE).

Thus the interlayer element of the invention can provide a consistent adhesion between the layers of the multilayer element and good quality to the final multilayer element (LE), which prolongs the life of the end article. In this crosslinking embodiment for improving haze performance, the used crosslinking agent is preferably peroxide.

In a specific embodiment, the present invention relates to a laminated glass layer element (GLE) comprising a first glass layer element, an interlayer element and a second glass layer element, in the given order, wherein the interlayer element comprises a polymer composition comprising a) at least a crosslinked ethylene copolymer, whereby the ethylene copolymer before being crosslinked fulfills the characteristics (i) and (ii)

(i) being a copolymer of ethylene and a $C_4$ to $C_8$ alpha olefin comonomer and (ii) having a density (according to ISO 1183) in the range of 855 kg/m$^3$ to below 880 kg/m$^3$, and the interlayer element is in adhering contact with said first glass layer element and said second glass layer element.

The invention also provides a use of the polymer composition as defined above, below or in claims, for producing a multilayer element (LE) or an article comprising the multilayer element (LE).

The invention also provides a use of the polymer composition as defined above, below or in claims, for producing a laminated glass layer element (GLE) or an article comprising the laminated glass layer element (GLE).

The invention further provides a use of the polymer composition of the invention for producing a multilayer element (LE), as defined above, below or in claims, a use of said multilayer element (LE) for producing an article comprising said multilayer element (LE).

The invention further provides a use of the polymer composition of the invention for producing a laminated glass layer element (GLE), as defined above, below or in claims, a use of said laminated glass layer element (GLE) for producing an article comprising said laminated glass layer element (GLE).

The invention further provides an article comprising the multilayer element (LE) as defined above, below or in claims.

The invention further provides an article comprising the laminated glass layer element (GLE) as defined above, below or in claims.

The invention further provides the use of the multilayer element (LE) as defined above, below or in claims or of the laminated glass element (GLE) as defined above, below or in claims for producing an article comprising the multilayer element (LE) or the laminated glass layer element (GLE), for construction applications, like elements in buildings, for instance architectural elements, such as exterior/interior elements, like façades outside the building, window elements, door elements or indoor wall elements; for elements in bridges; for elements in vehicles, such as windows in cars, trains, airplanes or ships; for elements in production equipments, like safety windows in machines; for elements in household devices; for projection applications, like head-up displays, or for elements in furniture etc.

The invention further provides an article, as defined above, below or in claims, which is an article for construction applications, like elements in buildings, for instance architectural elements, such as exterior/interior elements, like façades outside the building, window elements, door elements or indoor wall elements; for elements in bridges; for elements in vehicles, such as windows in cars, trains, airplanes or ships; for elements in production equipments, like safety windows in machines; for elements in production equipments, like safety windows in machines; for elements in household devices; for projection applications, like head-up displays, or for elements in furniture etc., preferably, which is an article selected from a safety layer element, an insulation layer element or a thermal layer element, or any combination thereof, preferably an article which is a safety layer element, an insulation layer element or a thermal layer element, or any combination thereof consisting of the multilayer element (LE) or the laminated glass element (GLE).

The invention further provides a process for producing the multilayer element (LE) of the invention.

The invention further provides a process for producing the laminated glass layer element (GLE) of the invention.

The invention further provides a process for producing an article of the invention.

The multilayer element (LE), the laminated glass layer element (GLE), the interlayer element, the polymer composition, the polymer (a) thereof, the first and second layer elements, the article and process for producing the layer element (LE) and article thereof, as well as the article and process for producing the laminated glass layer element (OLE) and article thereof together with further details, preferred embodiments, ranges and properties thereof, are described below and in claims, which preferred embodiments, ranges and properties can be in any combination and combined in any order.

The Interlayer Element of the Multilayer Element (LE)

The interlayer layer element comprises a layer, which comprises, preferably consists of, a polymer composition comprising the polymer (a). The polymer composition is referred herein also shortly as "the composition" or "the composition of the invention". The interlayer layer element may be a monolayer element comprising, preferably consisting of, the polymer (a). Alternatively, the interlayer layer element may comprise two or more layers, which each comprise, preferably consist of, a polymer composition comprising the polymer (a). If such layers of polymer composition of the invention are adjacent, then they are considered as a "monolayer", since fused together by before solidification of such layers during the production process of the layer element.

The polymer composition of the interlayer element comprises at least one crosslinked ethylene copolymer (a).

The non-crosslinked ethylene copolymer (a), i.e. before being crosslinking, fulfills at least characteristics (i) and (ii).

Ad Characteristics (i):

The non-crosslinked copolymer is a copolymer of ethylene and a $C_4$ to $C_8$ alpha-olefin comonomer.

$C_4$ to $C_8$ alpha-olefin comonomers are for example 1-butene, 1-hexene or 1-octene. Preferably the comonomer is 1-butene or 1-octene, more preferably the comonomer is 1-octene.

The amount of comonomer is usually in the range of 20.0 wt % to 45.0 wt %, depending on the chosen comonomer and the desired density.

Ad Characteristics (ii):

The non-crosslinked copolymer has a density in the range of from 855 to below 880 kg/m$^3$, preferably in the range of from 855 to 875 kg/m$^3$ and more preferably in the range of 860 to 872 kg/m$^3$.

Suitable non-crosslinked copolymers may have the following additional characteristics:

The MFR$_2$ (ISO 1133; 190° C.; 2.16 kg) of suitable copolymers is in the range of 0.1 to 20.0 g/10 min, preferably in the range of 0.5 to 15.0 g/10 min and more preferably in the range of 1.0 to 10.0 g/10 min.

The melting points (measured with DSC according to ISO 11357-3:1999) of suitable copolymers are below 100° C., preferably below 80° C., more preferably below 70° C. and most preferably below 60° C.

The molecular mass distribution Mw/Mn of suitable copolymers is most often below 4, such as 3.8 or below, but is at least 1.7. It is preferably between 3.5 and 1.8.

Suitable copolymers can be any copolymer of ethylene and $C_4$ to $C_8$ alpha-olefin comonomer having the at least above defined characteristics (i) and (ii), which are commercial available, i.a. from Borealis AG under the tradename Queo, from DOW under the tradename Engage or Affinity, or from Mitsui under the tradename Tafmer.

Alternately these copolymers can be prepared by known processes, in a one stage or two stage polymerization process, comprising solution polymerization, slurry polymerization, gas phase polymerization or combinations therefrom, in the presence of suitable catalysts, like vanadium oxide catalysts or single-site catalysts, e.g. metallocene or constrained geometry catalysts, known to the art skilled persons.

Preferably these copolymers are prepared by a one stage or two stage solution polymerization process, especially by high temperature solution polymerization process at temperatures higher than 100° C.

Such process is essentially based on polymerizing the monomer and a suitable comonomer in a liquid hydrocarbon solvent in which the resulting polymer is soluble. The polymerization is carried out at a temperature above the melting point of the polymer, as a result of which a polymer solution is obtained. This solution is flashed in order to separate the polymer from the unreacted monomer and the solvent. The solvent is then recovered and recycled in the process.

Preferably the solution polymerization process is a high temperature solution polymerization process, using a polymerization temperature of higher than 100° C. Preferably the polymerization temperature is at least 110° C., more preferably at least 150° C. The polymerization temperature can be up to 250° C.

The pressure in such a solution polymerization process is preferably in a range of 10 to 100 bar, preferably 15 to 100 bar and more preferably 20 to 100 bar.

The liquid hydrocarbon solvent used is preferably a $C_{5-12}$-hydrocarbon which may be unsubstituted or substituted by $C_{1-4}$ alkyl group such as pentane, methyl pentane, hexane, heptane, octane, cyclohexane, methylcyclohexane and hydrogenated naphtha. More preferably unsubstituted $C_{6-10}$-hydrocarbon solvents are used.

A known solution technology suitable for the process according to the invention is the BORCEED (former COMPACT) technology.

According to the invention the polymer composition, i.e. the ethylene copolymer is crosslinked.

Crosslinking may be carried out by different means, such as for example by radical reaction (e.g. by organic peroxides), by a sulphur vulcanizing system or also by irradiation.

Preferably the ethylene copolymer is crosslinked by the use of organic peroxides as crosslinking agent. More preferably crosslinking is initiated with a peroxide that is liquid at ambient temperatures (e.g. room temperature), like tert-butyl cumyl peroxide, 2,5-Dimethyl-2,5-di(tert-butylperoxy)hexane, 2,5-Dimethyl-2,5-di(tert-butylperoxy)hexane, 3,3,5,7,7-Pentamethyl-1,2,4-trioxepane, tert-Butylperoxy 2-ethylhexyl carbonate, tert-butylperoxy-2-ethylhexylcarbonate, (TBPEHC) or 2,5-dimethyl-2,5-di(tert-butylperoxy)hexane (DHBP) etc. Such peroxides are well known to the art skilled person. They are commercially available from e.g. AkzoNobel under the Tradename Trigonox® or from Arkema under the Tradename Luperox®. Examples are Trigonox® 101, Luperox® 101, Trigonox® 145-E85, Trigonox® T, Luperox® 801, etc.

It is also possible to use two or more different types of peroxide, which are liquid at ambient temperatures (i.e. room temperature). Preferably, only one kind of peroxide is used.

The peroxide or peroxide mixture is used in an amount of 0.5 wt % up to maximum 3.0 wt %, preferably 0.5 wt % up to 2.0 wt %, based on the polymer composition.

Thus in a preferred embodiment the polymer composition according to the present invention is prepared by crosslinking the ethylene copolymer with 0.1 to max 3.0 wt % of a peroxide or peroxide mixture being liquid at ambient temperature.

The ethylene copolymer suitable for the present invention can be in a well-known powder, grain or pellet form. Pellets mean herein generally any polymer product, which is formed from reactor-made polymer (obtained directly from the reactor) by post-reactor modification into solid polymer particles. A well-known post-reactor modification process is pelletizing a melt-mix of polymer component(s) and optional additive(s) in a pelletizing equipment to form solid pellets. Pellets can be of any size and shape.

The crosslinking agent, e.g. the peroxide, can be incorporated into the ethylene copolymer, e.g. ethylene copolymer pellets, to form a product, preferably a pellet product, wherein the product, preferably pellet product, comprises the ethylene copolymer component together with the crosslinking agent. The crosslinking agent can be incorporated into the ethylene copolymer e.g. by melt-mixing with the ethylene copolymer and by pelletizing the obtained melt-mix or by impregnating the crosslinking agent into the solid ethylene copolymer pellets.

Alternatively, the crosslinking agent can be provided in a well-known master batch or can be directly injected into the device, e.g. the extruder, wherein the crosslinking takes place.

Preferably, the ethylene copolymer is impregnated with peroxide or the peroxide is added as master batch, more preferably the ethylene copolymer is impregnated with peroxide.

In the crosslinking process crosslinking conditions can vary depending i.a. on the used materials. The crosslinking is effected e.g. in a known manner, preferably at an elevated temperature. Preferably, the lowest temperature during the crosslinking step is above 140° C., more preferably above 150° C. The crosslinking may be carried out in a liquid or gas medium, such as in an inert gas, such as N2, atmosphere.

The crosslinking step is carried out under pressurized conditions to prevent the formation of voids due to volatile decomposition products of e.g. peroxides.

The pressure during the crosslinking step of the invention is typically up to 200 bar, like up to 180 bar, preferably up to 160 bar in inert atmosphere.

In one embodiment of the invention the composition of suitably comprises additive(s), i.e. said crosslinked ethylene copolymer may comprise further components, typically additives, such as antioxidants, crosslinking boosters, scorch retardants, processing aids, fillers, coupling agents, ultraviolet absorbers, stabilizers, antistatic agents, nucleating agents, slip agents, plasticizers, lubricants, viscosity control agents, tackifiers, anti-blocking agents, surfactants, extender oils, acid scavengers and/or metal deactivators. The content of said additives may preferably range from 0 to 8 wt %, based on the total weight of the polymer composition.

In another embodiment of the invention the ethylene copolymer is first being grafted before being crosslinked.

In this case the ethylene copolymer before being crosslinked bears silane group(s) containing units (b), whereby these units (b) are introduced with grafting component (b').

Grafting of the grafting component (b') to a copolymer is a well known technique and well documented in the polymer field and within the skills of a skilled person.

The grafting component (b') is added in such an amount, so that between 0.1 and 2.0 wt % of component (b') is grafted on said copolymer (a).

In the case that the ethylene copolymer before being crosslinked bears silane group(s) containing units (b), these units are introduced with grafting component (b'), which is preferably a hydrolysable unsaturated silane compound represented by the formula (I):

$$R^1 SiR^2_q Y_{3-q} \quad (I)$$

wherein $R^1$ is an ethylenically unsaturated hydrocarbyl, hydrocarbyloxy or (meth)acryloxy hydrocarbyl group, each $R^2$ is independently an aliphatic saturated hydrocarbyl group, Y which may be the same or different, is a hydrolysable organic group and q is 0, 1 or 2;

Further suitable silane group(s) containing unit is e.g. gamma-(meth)acryl-oxypropyl trimethoxysilane, gamma (meth)acryloxypropyl triethoxysilane, and vinyl triacetoxysilane, or combinations of two or more thereof.

One suitable subgroup of the grafting compound (b') of formula (I) is an unsaturated silane compound of formula (II)

$$CH_2=CHSi(OA)_3 \quad (II)$$

wherein each A is independently a hydrocarbyl group having 1-8 carbon atoms, suitably 1-4 carbon atoms.

The grafting compound (b') is preferably the compound of formula (II) which is vinyl trimethoxysilane, vinyl bismethoxyethoxysilane, vinyl triethoxysilane, more preferably vinyl trimethoxysilane or vinyl triethoxysilane and most preferably vinyl trimethoxysilane.

The amount (wt %) of the silane group(s) containing units (b) present in the copolymer (a), is preferably 0.1 to 2.0 wt %, preferably 0.4 to 1.6 wt % and even more preferably 0.5 to 1.5 wt %, when determined according to "Quantification of VTMS in copolymer-g-VTMS" as described below under "Determination Methods".

Subsequent to the grafting step, the above described crosslinking is performed in order to yield the crosslinked ethylene copolymer.

In a preferable embodiment the polymer composition consists of the crosslinked ethylene copolymer (a) as the only polymeric component(s). "Polymeric component(s)" exclude herein any carrier polymer(s) of optional additive, e.g. carrier polymer(s) used in master batch(es) of additive(s) optionally present in the composition. Such optional carrier polymer(s) are calculated to the amount of the respective additive based on the amount (100%) of the polymer composition.

Preferably the interlayer element comprises a layer consisting of the polymer composition of the invention. Preferably the interlayer element consists of the polymer composition of the invention.

The interlayer element is preferably an interlayer film, an interlayer sheet or an interlayer foil, most preferably an interlayer film.

Said interlayer element can be produced by extrusion, e.g. cast film or blown film extrusion, including coextrusion, using conventional extrusion equipment and extrusion conditions suitable for the desired end use of the interlayer element, which equipment and conditions can be selected by a skilled person. Alternatively said interlayer element can be produced by lamination using conventional lamination equipment and conditions suitable for the desired end use of the interlayer element, which equipment and conditions can be selected by a skilled person. Furthermore, said inter layer element may be produced using the combination of extrusion and lamination, as well known by a skilled person.

The interlayer element is preferably the sole polymeric layer element between the first and second layer element. Preferably, the interlayer element consists of one layer (monolayer element). Accordingly, the inter layer element is most preferably a monolayer element. The term "monolayer element" is understood herein as a single layer consisting of the polymer composition of the interlayer element of invention. I.e. "Single layer" means one or more layers, wherein in case of more layers, the layers consist of the polymer composition of the invention and are fused together resulting in one layer (monolayer). Accordingly said monolayer element as said interlayer element can be one layer (monolayer). Or alternatively, said monolayer element as said interlayer element can be produced by combination of two or more layers of the polymer composition of the invention which layers are then fused together (adhered) during the production process of the interlayer element. The layers can be produced e.g., by coextrusion or, alternatively, by extrusion and subsequent lamination. The one layer is typically produced by extrusion. The preferred interlayer element is monolayer element, wherein the layer(s) consist of the polymer composition of the invention.

The interlayer element, preferably the interlayer element as monolayer element may contain non-polymeric elements, like reinforcing material, such as wire web, which non-polymeric material may be embedded to the interlayer element for instance during the production of the interlayer element.

In one embodiment, the interlayer element, which is preferably a monolayer element, contains non-polymeric elements selected reinforcing elements, thermal elements or electrically active elements, or any combinations thereof.

In a further embodiment, the interlayer element, which is preferably a monolayer element, contains non-polymeric elements selected from reinforcing elements or thermal elements which are used in safety glass elements or thermal elements, or in any combinations thereof.

In a further embodiment, the interlayer element is a monolayer element and does not contain any non-polymeric elements as defined above.

The interlayer element according to the present invention shows extremely low haze values.

The First and Second Layer Element of the Multilayer Element (LE)

The first layer element or the second layer element is preferably rigid. In one embodiment, both the first layer element and the second layer element are rigid.

The expression "rigid" means that the layer elements are non-flexible (i.e. stiff). I.e. the layer elements, when in solid state, do not return in original shape when deformed using force, e.g. compression, impact or bending force. For instance, glass element and polycarbonate (PC) polymer element are rigid elements. I.e. if bended or when broken due to use of impact force, then would break to pieces. E.g. in case of conventional window glass, the at least part of the glass pieces would normally fall apart (down).

The first layer element and the second layer element of the layer element (LE) can be same or different and comprise a glass layer element or a polymeric layer element. In one embodiment the first layer element and the second layer element are of the same material. Glass layer element of the first layer element and of the second layer element can be of any conventional glass material. Preferably, the glass layer element comprises, preferably consists of, one of, without limitation, window glass, plate glass, silicate glass, sheet glass, float glass, coloured glass or specialty glass such as alumina-silicate glass, High-Ion Exchange (HIE™) glass, soda-lime glass, borosilicate glass or ceramic glass.

The Multilayer Element (LE)

The expression "adhering contact" is defined herein in that the surface of the interlayer element of the invention and the surface of the first layer element facing towards each other and the surface of the interlayer element of the invention and the surface of the second layer element facing towards each other are in adhering contact to each other either directly or via an adhesive layer.

The expression "adhesive layer" means a layer which is different from the interlayer element and which have different polymer composition than the polymer composition of the invention of the interlayer element. Moreover the adhesive layer is usually a continuous or discontinuous and known as hot melt adhesive, which has a well-known meaning in the prior art. Such adhesive layers have only enhancing adhering function, not the adhering function as defined for the interlayer element to keep the integrity of the first and the second layer elements.

Figure 1:
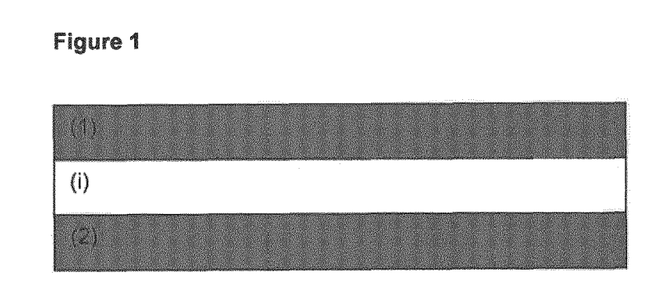

More preferably, the surface of the interlayer element of the invention and the surface of the first layer element facing towards each other and the surface of the interlayer element of the invention and the surface of the second layer element facing towards each other are in direct contact to each other without any additional adhesive layers in between. FIG. 1 illustrates this most preferable embodiment.

Preferably there are no additional layers between the contacting surfaces of first layer element and the inter layer element and, respectively, between the contacting surfaces of the second layer element and the inter layer element, and the interlayer element is preferably a monolayer element.

The multilayer element (LE) is preferably transparent. The term "transparent" means herein that the multilayer element (LE) allows light to pass 100% or less through the multilayer element (LE) so that objects behind can be distinctly seen or at least outlined.

The transparency of the multilayer element (LE) can look like seen through a normal glass window. The multilayer element (LE) covers additionally the embodiments where the multilayer element (LE) is tinted (coloured) or otherwise designed as regards to appearance. Such tinted multilayer element (LE) can be treated in known manner so that the multilayer element (LE) is transparent from both sides or only from one side. Examples such tinted multilayer elements (LE) are articles, like tinted (coloured) glass door elements, tinted window elements in buildings or tinted window elements in vehicles, like cars.

The thickness of the first layer, second layer and interlayer element of the multilayer element (LE), as well as the thickness of the final multilayer element (LE), can vary depending on the desired end application, as evident for a skilled person. For instance, the thickness of the first and second layer element can be within the ranges typically used in the prior art in the respective end application. The thickness of the interlayer element can also be chosen by the skilled person for the respective end application. As an example only thickness of the interlayer element can be in the range from 0.03 to 3.0 mm, like from 0.1 to 2.5 mm, such as from 0.2 to 2 mm. The exemplified thickness of the interlayer element most preferably is a monolayer element of one or two or more layers as defined above, wherein the layer(s) consist(s) of the polymer composition of the interlayer of the invention.

The invention further provides the use of the polymer composition as defined above or in claims for producing a multilayer element (LE) of the invention.

The invention further provides a process for producing the multilayer element (LE) of the invention, wherein the process comprises the steps of assembling the first layer element, interlayer element and the second layer element to a multilayer assembly;

laminating the layers of the multilayer assembly at elevated temperature and optionally at vacuum conditions to obtain multilayer element (LE); and recovering the obtained multilayer element (LE).

The lamination step is typically carried out in two steps, in pre-lamination step and then in final lamination step. In pre-lamination step, any air bubbles are removed between the layer elements of the multilayer (LE) assembly. Air removal can be effected for instance by rolling press process or by vacuum process. The vacuum process can be carried out e.g. in so-called vacuum bag process or vacuum-ring process. The final lamination is carried out at elevated temperature and optionally, and preferably, under vacuum.

The lamination process/conditions and equipment are well known in the art, and can be chosen by a skilled person depending on the final end article of the multilayer element (LE). Moreover, the pre-lamination and final lamination steps are typically carried out in the same lamination process.

In a specific embodiment the present invention relates to a laminated glass layer element (GLE) comprising a first glass layer element, an interlayer element and a second glass layer element, in the given order, wherein the interlayer element comprises a polymer composition comprising a) at least a crosslinked ethylene copolymer, whereby the ethylene copolymer before being crosslinked fulfills the characteristics (i) and (ii)

(i) being a copolymer of ethylene and a $C_4$ to $C_8$ alpha olefin comonomer and (ii) having a density (according to ISO 1183) in the range of 855 kg/m$^3$ to below 880 kg/m$^3$, and is optionally grafted before being crosslinked, and the interlayer element is in adhering contact with said first glass layer element and said second glass layer element.

Thereby, the laminated glass layer element (GLE) includes all embodiments of the multilayer element (LE) with the specification that the first and second elements are glass layer elements.

Further, the first glass layer element and the second glass layer element include all embodiments as defined above and below for the first and second layer element when specified as glass layer elements.

The interlayer element and the polymer composition include all embodiments as defined above and below.

The multilayer element (LE), like preferable laminated glass layer element (GLE), including the interlayer element shows preferably good optical properties such as low haze in addition to a consistent adhesion between the layers of the multilayer element (LE) and good quality to the multilayer element (LE), preferably to final laminated glass layer element (GLE), which prolongs the life of the end article as discussed above for the multilayer element (LE).

FIG. 1 illustrates the most preferable embodiment of the layer element (LE) of the invention, wherein the surface of the interlayer layer element (i) facing the surface of the first layer element (1) are in direct contact with each other and preferably without any adhesive layer(s) in between; and, on the opposite side of the interlayer element (i), the surface of the interlayer layer element (i) facing the surface of the second layer element (2) are in direct contact with each other and preferably without any adhesive layer(s) in between.

The multilayer element (LE) and the laminated glass layer element (GLE) can be used for building and construction applications, architectural glasses, interior/exterior design applications as described above, below or in claims.

In one preferable embodiment the present invention is directed to a multilayer element (LE) for use in a safety layer element, an insulation layer element or a thermal layer element, or in any combination thereof, wherein the multilayer element (LE) comprises a first layer element, an interlayer element and a second layer element, in the given order, wherein the first layer element comprises a glass layer or a polymeric layer;

the interlayer element comprises a polymer composition comprising a) at least a crosslinked ethylene copolymer, whereby the ethylene copolymer before being crosslinked fulfills the characteristics (i) and (ii)

(i) being a copolymer of ethylene and a $C_4$ to $C_8$ alpha olefin comonomer and (ii) having a density (according to ISO 1183) in the range of 855 kg/m$^3$ to below 880 kg/m$^3$, and is optionally grafted before being crosslinked, and the second layer element comprises a glass layer or a polymeric layer;

and wherein the interlayer element is in adhering contact with said first and second layer element.

An Article Comprising the Multilayer Element (LE)

The invention further provides the use of the multilayer element (LE) as defined above, below or in claims or the laminated glass element (GLE) as defined above, below or in claims for producing an article comprising the multilayer element (LE) or the laminated glass layer element (GLE), for construction applications, like elements in buildings, for instance architectural elements, such as exterior/interior elements, like façades outside the building, window elements, door elements or indoor wall elements etc.; for elements in bridges; for elements in vehicles, such as windows etc. in cars, trains, airplanes or ships; for elements in production equipments, like safety windows in machines etc.; for elements in household devices; for projection applications, like head-up displays, or for elements in furniture etc.; not limiting to above mentioned applications.

The invention further provides an article comprising the multilayer element (LE) of the invention.

The article can be for any application, like article for construction applications, like elements in buildings, for instance architectural elements, such as exterior/interior elements, like façades outside the building, window elements, door elements or indoor wall elements etc.; for elements in bridges; for elements in vehicles, such as windows etc. in cars, trains, airplanes or ships; for elements in production equipments, like safety windows in machines etc.; for elements in production equipments, like safety windows in machines; for elements in household devices; for projection applications, like head-up displays, or for elements in furniture etc.; not limiting to above mentioned applications, comprising the multilayer element (LE) as defined above, below or in claims or the laminated glass element (GLE) as defined above, below or in claims.

The article of the invention can also be e.g. a construction element with integrated photovoltaics functionality. In this context, the article is part of the construction element and not a separate photovoltaic module device installed separately to the building, like on the roof of a building. I.e. the article of the invention is an integrated part of the construction element like wall or window of the building. Accordingly and preferably, the multilayer element (LE), the laminated glass element (GLE) or the article of the invention is not part of a Photovoltaic module device which comprises a front protective layer element, a front encapsulation layer element, a photovoltaic element, a rear encapsulation element and a protective backsheet element and which is produced as a separate article and installed as separate unit to a construction element.

In one preferable embodiment, the article is for applications wherein one or more of the safety, insulation or thermal properties are desired. As non-limiting example of such articles comprising the multilayer element (LE) or laminated glass element (GLE), as defined above, below or in claims, are e.g. articles for construction applications, like elements in buildings, for instance architectural elements, such as outdoor wall elements (i.e. façades outside the building), or indoor wall elements, window elements, door elements, etc.; for elements in bridges; for elements in vehicles (windows in cars, trains, airplanes, ships etc); for elements in production equipments, like safety windows in machines; for elements in production equipments, like safety windows in machines; for elements in household devices; for projection applications, like head-up displays, or for elements in furniture etc.

One example of the article, as defined above, below or in claims, is for instance selected from a safety layer element, an insulation layer element or a thermal layer element, or any combination thereof. Preferably, in this embodiment of the article, the safety layer element, the insulation layer element or the thermal layer element, or any combination thereof, consists of the layer element (LE).

In one preferable embodiment the article is a multilayer element (LE) which is a safety element, like safety glass, such as safety glass window element; a safety glass indoor or outdoor door element; a safety glass outdoor (façade) or indoor wall element of a building; or safety glass window in a vehicle, like in a car. The term "safety glass" covers herein the options where the first or second layer element material, or both, is/are glass or a polymeric material. In this embodiment the article is preferably a multilayer element (LE), preferably a glass laminate element (GLE), which is a safety layer element, preferably a safety glass element, comprising, wherein at least one of first and second layer element of the layer element preferably comprises, preferably consists of, a glass layer. More preferably, in this embodiment, both the first and second layer element comprises, preferably consists of, a glass layer. More preferably, in this embodiment, the interlayer element is a monolayer element consisting of the polymer (a) of the invention.

According to a preferred embodiment of the present invention the space between the first and second layer elements, respectively, consists of the interlayer element and the interlayer element consists of the polymer (a) of the invention or the interlayer element consists of a polymer part and non-polymeric elements, wherein the polymer part consists of polymer (a) of the invention, and wherein the non-polymeric elements are selected from the group consisting of heating means or thermal elements like electrical wires, reinforcing material such as wire web, electrically active elements, and combinations thereof, and/or wherein the non-polymeric elements do not comprise electronic devices like photovoltaic elements.

The invention further provides a process for producing an article comprising the multilayer element (LE), wherein the process comprises the steps of a) producing a multilayer element (LE) by
assembling the first layer element, interlayer element and the second layer element to a multilayer assembly;
laminating the layers of the multilayer assembly at elevated temperature and optionally at vacuum conditions to obtain multilayer element (LE); and
recovering the article comprising the obtained multilayer element (LE) of the invention.

In one embodiment of the invention, the process for producing an article of the invention comprises the steps of
assembling the first layer element, like glass layer element, the interlayer element of the invention and the second layer element, like glass layer element, to a multilayer element (LE) assembly;
subjecting the obtained assembly to so-called pre-lamination step to remove any air bubbles;
subjecting the obtained pre-laminated multilayer element (LE) to heat and pressure to obtain the multilayer element (LE); and
recovering the article comprising the obtained multilayer element (LE) of the invention.

The present invention is further directed to a process for producing the multilayer element (LE) as described above or the laminated glass element (GLE) as described above, wherein the process comprises the step of a) providing a copolymer of ethylene and a $C_4$ to $C_8$ alpha olefin comonomer having a density (according to ISO 1183) in the range of 855 kg/m$^3$ to below 880 kg/m$^3$, b) optionally grafting the copolymer of ethylene and a $C_4$ to $C_8$ alpha olefin comonomer, c) crosslinking said copolymer of ethylene and a $C_4$ to $C_8$ alpha olefin comonomer by crosslinking the ethylene copolymer via peroxide crosslinking with 0.1 to max 3.0 wt % of a peroxide being liquid at ambient temperature, thereby obtaining a crosslinked ethylene copolymer, d) producing an interlayer element by extrusion and/or lamination of the crosslinked ethylene copolymer obtained in step c), e) providing a first layer element and a second layer element and assembling the first layer element, the interlayer element and the second layer element to a multilayer assembly to obtain the multilayer element (LE), and f) laminating the layers of the multilayer assembly at elevated temperature and optionally at vacuum conditions to obtain a multilayer laminated glass layer element (GLE).

Determination Methods

Melt Flow Rate: The melt flow rate (MFR) is determined according to ISO 1133 and is indicated in g/10 min. The MFR is an indication of the flowability, and hence the processability, of the polymer. The higher the melt flow rate, the lower the viscosity of the polymer. The $MFR_2$ of polypropylene is measured at a temperature 230° C. and a load of 2.16 kg. The $MFR_2$ of polyethylene is measured at a temperature 190° C. and a load of 2.16 kg.

Density: ISO 1183, measured on compression moulded plaques.

Quantification of VTMS in PE-g-VTMS Copolymer

Quantitative nuclear-magnetic resonance (NMR) spectroscopy was used to quantify the VTMS content of the polymers.

Quantitative $^1$H NMR spectra recorded in the molten-state using a Bruker Avance III 500 NMR spectrometer operating at 500.13 MHz. All spectra were recorded using a $^{13}$C optimised 7 mm magic-angle spinning (MAS) probehead at 150° C. using nitrogen gas for all pneumatics. Approximately 200 mg of material was packed into a 7 mm outer diameter zirconia MAS rotor and spun at 4 kHz. This setup was chosen primarily for the high sensitivity needed for rapid identification and accurate quantification {klimke06, parkinson07, castignolles09}. Standard single-pulse excitation was employed applying short recycle delay of 2 s. A total of 128 transients were acquired per spectrum.

Quantitative $^1$H NMR spectra were processed, integrated and quantitative properties determined using custom spectral analysis automation programs. All chemical shifts are internally referenced to the polyethylene methylene signal at 1.33 ppm.

Characteristic signals resulting from grafting of vinyltrimethylsiloxane, in various comonomer sequences, were observed. The vinyltrimethylsiloxane grafting was quantified using the integral of the signal at 3.52 ppm assigned to the 1VTMS sites {brandolini01}, accounting for the number of reporting nuclei per comonomer:

gVTMS = $I_{1VTMS}/9$

The ethylene content (E) was quantified using the integral of the bulk aliphatic (bulk) signal between 0.00-3.00 ppm. This integral must be compensated by subtracting 4 times gVTMS (2 methylene groups, 2VTMS and 3VTMS) and add once gVTMS (*VTMS missing 1 proton) in total subtracting 3 times gVTMS.

$E = (bulk - 3*gVTMS)/4$

It should be noted that an insignificant error is introduced due to the inability to compensate for the saturated chain ends without associated branch sites.

The total mole fractions of vinyltrimethylsiloxane in the polymer was calculated as:

$fVTMS = gVTMS/(E+gVTMS)$

The total comonomer incorporations of vinyltrimethylsiloxane in weight percent was calculated from the mole fractions in the standard manner:

$cVTMS$ [wt %] = [100*(fVTMS*148.23)]/ [(fVTMS*148.23)+((1−fVTMS)*28.05)]

The quantification of grafted vinyltrimethylsiloxane in weight percent cVTMS [wt %] by $^1$H NMR as described is independent from additional alpha-co-olefins with even numbers of carbons e.g. C4, C6 or C8 which might be incorporated in the polyethylene chain.

brandolini01
A. J. Brandolini, D. D. Hills, "NMR spectra of polymers and polymer additives", Marcel Deker Inc., 2000
klimke06
Klimke, K., Parkinson, M., Piel, C., Kaminsky, W., Spiess, H. W., Wilhelm, M., Macromol. Chem. Phys. 2006; 207:382.
parkinson07
Parkinson, M., Klimke, K., Spiess, H. W., Wilhelm, M., Macromol. Chem. Phys. 2007; 208:2128.
castignolles09
Castignolles, P., Graf, R., Parkinson, M., Wilhelm, M., Gaborieau, M., Polymer 50 (2009) 2373

Haze: The light that passes through the transparent material can be affected by irregularities within it. This causes the light to scatter in different directions giving haze. The origin of the internal haze in pure polymers is light scattering due to different refractive index of crystalline and amorphous regions in the polymer. By laminating the interlayer between two glass slides, the direct transmittance, scattered transmittance, and reflectance is measured with an ultraviolet/visible/near infrared (UV/VIS/NIR) Perkin Elmer Lambda 900 spectrometer equipped with an integrating sphere. With an integrating sphere both the total transmittance i.e. direct transmittance+scattered transmittance and only the scattered (diffuse) transmittance can be recorded. The haze is calculated from the Equation below:

$$\text{Haze}(\lambda) = \frac{\text{diffuse transmittance }(\lambda)}{\text{total transmittance }(\lambda)} * 100\%*$$

The Sample Preparation for Haze Measurements was Done the Following:

Test Interlayer elements were produced by extruding the material into tape samples on a Collin 15 extruder (Teach-Line E20T). The same temperature profile, 120-120-130° C., was used for producing the tape samples (Test interlayer elements). The tape samples (Test interlayer elements) had a thickness of 0.45 mm and a width of 40 mm.

The obtained Test interlayer elements were laminated between two microscope glasses with a thickness of 1 mm. The used laminator was a commercial PEnergy L036LAB vacuum laminator. The lamination temperature for forming the Test laminates samples was 150° C. with a total lamination time of 6 minutes (2 minutes vacuum and 4 minutes pressing time).

Pressure during the lamination process was 200 mbar.

Experimental Part

Materials Used:

Ethylene-octene plastomer (P1) was used as ethylene copolymer in the experiments. The plastomer was produced in a solution polymerisation process (Borceed technology) using a metallocene catalyst and had the following properties as shown in Table 1.

The plastomer is commercially available from Borealis under the trade names Queo 7007LA.

TABLE 1

| Property | Unit | Value |
|---|---|---|
| density | Kg/m³ | 870 |
| MFR₂ | g/10 min | 6.6 |
| Melting point | ° C. | 48 |
| C8 content | Wt % | 33.0 |
| C2 content | Wt % | 77.0 |
| MWD | | 2.6 |

INVENTIVE EXAMPLES IE1 TO IE4

Crosslinking:

P1 was impregnated either with tert-butylperoxy-2-ethyl-hexylcarbonate, (TBPEHC, CAS No: 34443-12-4; supplier United Initiators) or with 2,5-dimethyl-2,5-di(tert-butylperoxy)hexane (DHBP, CAS No: 78-63-7, provided by United Initiators). The peroxide was soaked into the pellets of polymer P1 by tumbling 1 kg of material at a constant rate at a temperature of 30° C. for 24 hours.

After the peroxide soaking the material was used to produce the Test interlayer elements as described above under Sample Preparation for haze testing.

Table 2 shows the amount and kind of used peroxide

TABLE 2

| Example | peroxide | Amount [wt %] |
|---|---|---|
| CE1 | none | 0 |
| IE1 | TBPEHC | 1.0 |
| IE2 | TBPEHC | 1.5 |
| IE3 | DHBBP | 1.0 |
| IE4 | DHBP | 1.5 |

Figure 2:
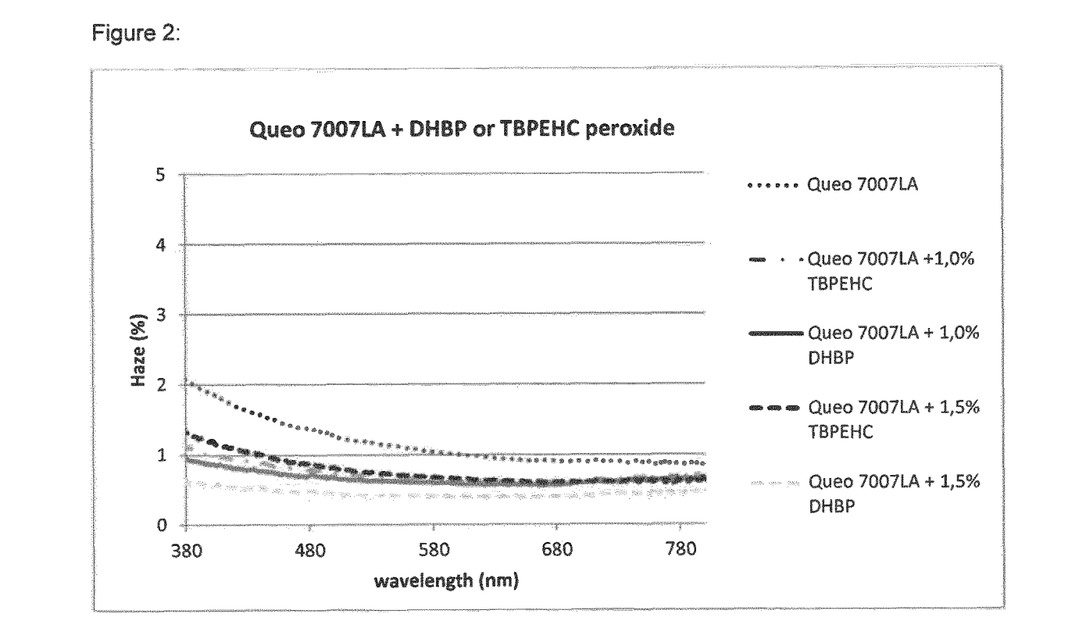
FIG. 2 shows the haze % as function of wavelength (nm) of laminate samples IE1 to IE4 in comparison to CE1.

FIG. 2 shows the haze % as function of wavelength (nm) of laminate samples IE1 to IE4 in comparison to CE1

The data given in the figures show that the haze performance (low haze) of the composition of the interlayer element of the invention is highly feasible for producing articles for versatile end applications wherein good optical properties, like low haze, are desired.

INVENTIVE EXAMPLE 5

P1 was first grafted before the crosslinking.

A commercially available mixture of VTMS+peroxide was used for the grafting step.

VTMS is vinyl trimethoxy silane (CAS-No 2768-02-7)

The mixture used was Dynasylan® Silfin 24 from Evonik.

This mixture comprises more than 25% VTMS, more than 1% but below 5% di-tert-butyl 1,1,4,4-tetramethyltetramethylene diperoxide (CAS-No 78-63-7), and not more than 0.2% tetramethyl orthosilicate (CAS-No 681-84-5).

The extruder used for the silane grafting was a Werner & Pfleiderer ZSK 30 co-rotating extruder with L/D of 38. Polymer throughput was 5 kg/h. Vacuum degassing was used (barrel 11) and the pressure was set to −0.20 bar(g). The temperature control of the extruder barrels was divided into control sections. Barrels 2&3, 5&6, 7&8, 9&10 and 11&12 share the same control loop in pairs and only took measurement from one barrel per pair. Barrel 4 was the only one with its own control loop. The barrels were heated with electrical heaters and cooled with closed loop water-glycol circulation. In addition to the temperature measurements from the barrels, the melt temperature and pressure at the die plate were also measured. The temperature profile of the Barrels 2&3 was set at 140° C., for Barrel 4 the temperature was 180° C. and the rest of the Barrels were set at a temperature of 200° C. The residence time was 60 seconds.

Queo 7001LA (P1) was grafted with 0.5 wt % of Silfin 24 from Evonik.

Crosslinking of the so grafted P1 was performed as described above using 1.0 wt % of DHBP.

Figure 3:
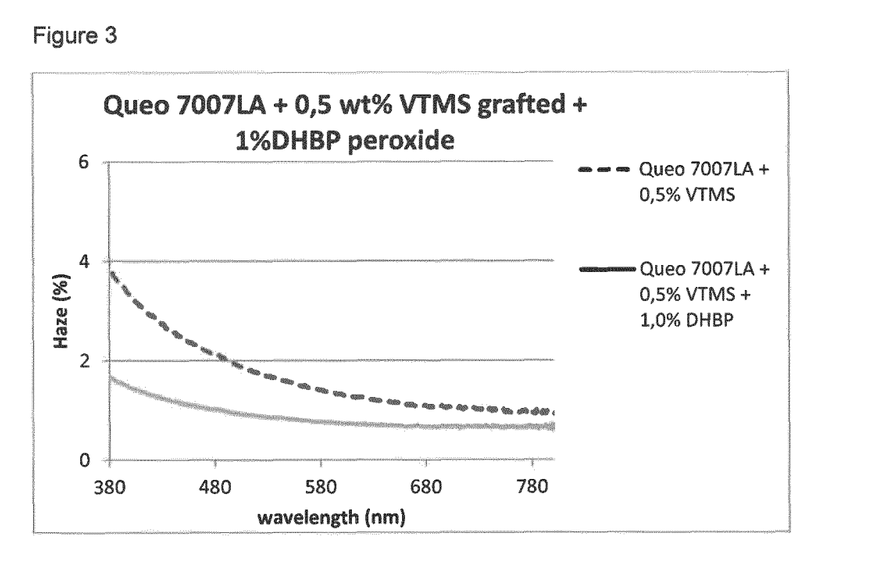
FIG. 3 shows the Haze performance improvement is shown by adding 1.0 wt % DHBP to a Queo 7007LA material with 0.5 wt % VTMS grafted.

In FIG. 3 the Haze performance improvement is shown by adding 1.0 wt % DHBP to a Queo 7007LA material with 0.5 wt % VTMS grafted.

The invention claimed is:

1. A multilayer element (LE), wherein the multilayer element (LE) comprises a first layer element, an interlayer element and a second layer element, wherein:
   the first layer element comprises a glass layer or a polymeric layer;
   the interlayer element comprises a polymer composition comprising at least a crosslinked ethylene copolymer, wherein the crosslinked ethylene copolymer has been prepared by crosslinking an ethylene copolymer via peroxide crosslinking, wherein the crosslinked ethylene copolymer is first grafted before being crosslinked, whereby the ethylene copolymer before being crosslinked fulfils the characteristics (i) and (ii)
   (i) being an ethylene-octene copolymer and
   (ii) having a density (according to ISO 1183) in the range of 855 kg/m³ to 875 kg/m³, and
   the second layer element comprises a glass layer element or a polymeric layer element;
   wherein the interlayer element is in adhering contact with said first and second layer element; and
   wherein the ethylene copolymer before being crosslinked bears silane group(s) containing units (b), whereby these units (b) are introduced with grafting component (b'), which is a hydrolysable unsaturated silane compound represented by the formula (I):

$$R^1SiR^2{}_qY_{3-q} \qquad (I)$$

wherein
R¹ is an ethylenically unsaturated hydrocarbyl, hydrocarbyloxy or (meth)acryloxy hydrocarbyl group,
each R² is independently an aliphatic saturated hydrocarbyl group,
Y which may be the same or different, is a hydrolysable organic group and
q is 0, 1 or 2; and
wherein the interlayer element is a monolayer element consisting of the polymer composition of the interlayer element and/or the multilayer element is transparent.

2. The multilayer element (LE) according to claim 1, wherein the first and the second layer element are rigid layer elements.

3. The multilayer element (LE) according to claim 1, wherein the ethylene copolymer before being crosslinked has an MFR₂ in the range of from 0.1 to 20.0 g/10 min and a melting temperature below 100° C.

4. The multilayer element (LE) according to claim 1, whereby the crosslinked ethylene copolymer has been prepared via peroxide crosslinking with 0.1 to max 3.0 wt % of a peroxide being liquid at ambient temperature.

5. The multilayer element (LE) according to claim 1, wherein the silane group(s) containing unit (b) is derived from a grafting component (b') selected from vinyl trimethoxysilane or vinyl triethoxysilane.

6. An article comprising the multilayer element (LE) according to claim 1.

7. A safety glass element comprising the multilayer element (LE) according to claim 1.

8. A process for producing an article comprising the multilayer element (LE) according to claim 1, wherein the process comprises the step of producing a multilayer element (LE) by:
- assembling the first layer element, interlayer element and the second layer element to a multilayer assembly;
- laminating the layers of the multilayer assembly at elevated temperature and optionally at vacuum conditions to obtain a multilayer element (LE); and
- recovering the article comprising the obtained multilayer element (LE).

* * * * *